(12) United States Patent
Yu et al.

(10) Patent No.: US 11,653,455 B2
(45) Date of Patent: May 16, 2023

(54) ELECTROPLATING EDGE CONNECTOR PINS OF PRINTED CIRCUIT BOARDS WITHOUT USING TIE BARS

(71) Applicant: NVIDIA CORPORATION, Santa Clara, CA (US)

(72) Inventors: Mingyi Yu, Saratoga, CA (US); Gregory Patrick Bodi, Santa Cruz, CA (US)

(73) Assignee: NVIDIA Corporation, Santa Clara, CA (US)

( * ) Notice: Subject to any disclaimer, the term of this patent is extended or adjusted under 35 U.S.C. 154(b) by 163 days.

(21) Appl. No.: 17/186,868

(22) Filed: Feb. 26, 2021

(65) Prior Publication Data
US 2022/0279659 A1    Sep. 1, 2022

(51) Int. Cl.
*H05K 1/00*     (2006.01)
*H05K 1/11*     (2006.01)
*H05K 1/14*     (2006.01)
*H05K 3/00*     (2006.01)
*H05K 3/06*     (2006.01)
(Continued)

(52) U.S. Cl.
CPC .............. *H05K 3/242* (2013.01); *H05K 1/117* (2013.01); *H05K 3/0047* (2013.01); *H05K 3/043* (2013.01); *H05K 2201/0347* (2013.01)

(58) Field of Classification Search
CPC ... H05K 1/00; H05K 1/11; H05K 1/14; H05K 1/115; H05K 1/117; H05K 1/118; H05K 1/147; H05K 1/0245; H05K 1/0274; H05K 3/00; H05K 3/06; H05K 3/24; H05K 3/40; H05K 3/43; H05K 3/44; H05K 3/47; H05K 3/52; H05K 3/67; H05K 3/242; H05K 3/243; H05K 3/244; H05K 3/363; H05K 3/4007; H05K 2201/0192; H05K 2201/0347; H05K 2201/0376; H05K 2201/0391; H05K 2201/0909; H05K 2201/0919; H05K 2201/0949; H05K 2201/09109; H05K 2201/09036; H05K 2201/09445; H05K 2201/09509; H05K 2201/09781; H05K 2203/054;
(Continued)

(56) References Cited

U.S. PATENT DOCUMENTS

2002/0020555 A1* 2/2002 Daido ................. H05K 3/0052
                                                                174/261
2002/0148636 A1* 10/2002 Belke ..................... H05K 1/117
                                                                174/254
(Continued)

*Primary Examiner* — Xiaoliang Chen
(74) *Attorney, Agent, or Firm* — Artegis Law Group, LLP

(57) ABSTRACT

A method for forming a printed circuit board includes: forming on a substrate a first conductive layer for a first edge connector pin and a first conductive layer for a second edge connector pin, wherein the first conductive layer for the first edge connector pin and the first conductive layer for the second edge connector pin are electrically coupled to one another via a first conductive layer for an electrical bridging element; electroplating a second conductive layer onto both the first conductive layer for the first edge connector pin and the first conductive layer for the second edge connector pin via a plating current conductor; and removing at least a portion of the electrical bridging element to electrically separate the first edge connector pin from the second edge connector pin.

12 Claims, 14 Drawing Sheets

(51) Int. Cl.
*H05K 3/24* (2006.01)
*H05K 3/40* (2006.01)
*H05K 3/44* (2006.01)
*H05K 3/04* (2006.01)

(58) Field of Classification Search
CPC ....... H05K 2203/058; H05K 2203/072; H05K 2203/0723
USPC ................ 174/255, 250, 254, 261; 361/785; 438/221; 439/629
See application file for complete search history.

(56) References Cited

U.S. PATENT DOCUMENTS

| | | | |
|---|---|---|---|
| 2006/0008970 A1* | 1/2006 | Oggioni | H05K 3/243 |
| | | | 438/221 |
| 2013/0083505 A1* | 4/2013 | Kobayashi | H05K 1/0245 |
| | | | 174/250 |
| 2017/0139160 A1* | 5/2017 | Noguchi | G02B 6/4279 |
| 2022/0256712 A1* | 8/2022 | Takimoto | H05K 3/4007 |

* cited by examiner

ELECTROPLATING EDGE CONNECTOR PINS OF PRINTED CIRCUIT BOARDS WITHOUT USING TIE BARS

BACKGROUND

Field of the Various Embodiments

The various embodiments relate generally to computer systems and related fabrication technology and, more specifically, to electroplating the edge connector pins of printed circuit boards without using tie bars.

Description of the Related Art

During operation, communication frequently occurs between the different functional modules found within modern computer systems and computing devices. Such functional modules are usually formed on separate printed circuit boards (PCBs) found within a given computer system or computing device. Some examples include, without limitation, sound cards, graphics cards, and network interface cards. Gold fingers, which are the gold-plated electrical contacts disposed along the connecting edge of a PCB, are typically used to deliver power to the different functional modules on PCBs and to transmit data and signals to and from the different functional modules on PCBs. Generally speaking, gold plating is used for the contact surfaces of the electrical contacts of a PCB due to the superior conductivity and corrosion resistance characteristics of gold alloys.

As the speed of data and communication signals transmitted between the different functional modules on PCBs increases, imperfections in the shape of the gold fingers on PCBs and metallic artifacts from fabricating the gold fingers on PCBs are more likely to degrade the integrity of these types of signals. For instance, the remains of the tie bars used to bias PCB edge connector pins during gold electroplating can create unwanted capacitance or signal reflection, both of which can contribute to signal noise. Conventional techniques for eliminating or removing the remains of tie bars include beveling and chemical etching processes. However, both of these techniques suffer from certain drawbacks.

Beveling processes involve mechanically removing material from a surface of a PCB. Beveling, for example, can be used to change a sharp edge of a PCB to an angled surface. Similarly, beveling can be used to remove the bulk of each tie bar that is attached to a gold finger after a gold electroplating process has completed. One drawback of using beveling for tie bar removal is that completely removing a tie bar is oftentimes not possible without cutting deeply into the PCB. Because deep cuts into PCBs are generally avoided, beveling usually leaves thin residual strips of the different tie bars intact. These residuals strips of material can negatively impact signal integrity. Another drawback of using beveling for tie bar removal is that metallic burrs sometimes are generated that can break off over time, relocate on the PCB, and cause an electrical short.

Chemical etching processes involve chemically removing material from a PCB and can completely remove tie bars that are attached to gold fingers. For example, by applying a liquid etchant that chemically removes the material making up the tie bars (e.g., the copper) without reacting with the material making up the gold fingers (e.g., gold alloy), tie bars can be fully removed from a PCB after a gold electroplating process. Alternatively, by selectively applying a liquid etchant to the tie bars while masking the non-targeted portions of a PCB, the tie bars can be fully removed from the PCB. One drawback of using chemical etching for tie bar removal is that additional etching and cleaning processes are required to remove the tie bars. These additional steps increase the overall complexity and cost of the PCB fabrication process.

As the foregoing illustrates, what is needed in the art are more effective ways of forming the edge connector pins of a printed circuit board.

SUMMARY

A method for forming a printed circuit board includes: forming on a substrate a first conductive layer for a first edge connector pin and a first conductive layer for a second edge connector pin, wherein the first conductive layer for the first edge connector pin and the first conductive layer for the second edge connector pin are electrically coupled to one another via a first conductive layer for an electrical bridging element; electroplating a second conductive layer onto both the first conductive layer for the first edge connector pin and the first conductive layer for the second edge connector pin via a plating current conductor; and removing at least a portion of the electrical bridging element to electrically separate the first edge connector pin from the second edge connector pin.

At least one technical advantage of the disclosed techniques relative to the prior art is that the disclosed techniques enable edge connector pins of PCBs to be formed without tie bar stubs. Consequently, the integrity of the data and communication signals transmitted through the edge connector pins formed using the disclosed techniques is not degraded by the noise oftentimes resulting from tie bar-related capacitance and signal reflection. A further advantage of the disclosed techniques is that additional chemical etching and cleaning processes are not required to form the edge connector pins having no tie bar stubs. Thus, the complexity of those additional chemical etching and cleaning processes is avoided. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

Figure 6:
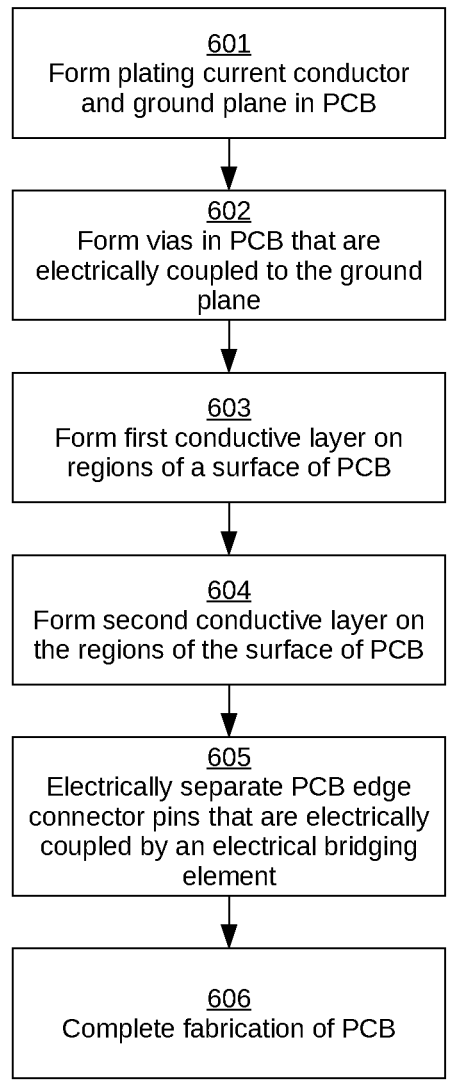
FIG. 6 sets forth a flowchart of method steps for forming the electroplated edge connector pins of a printed circuit board, according to other various embodiments.

Each of FIGS. 7A-7F illustrates a printed circuit board after different step of FIG. 6 has been completed, according to various other embodiments.

For clarity, identical reference numbers have been used, where applicable, to designate identical elements that are common between figures. It is contemplated that features of one embodiment may be incorporated in other embodiments without further recitation.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

System Overview

Figure 1:
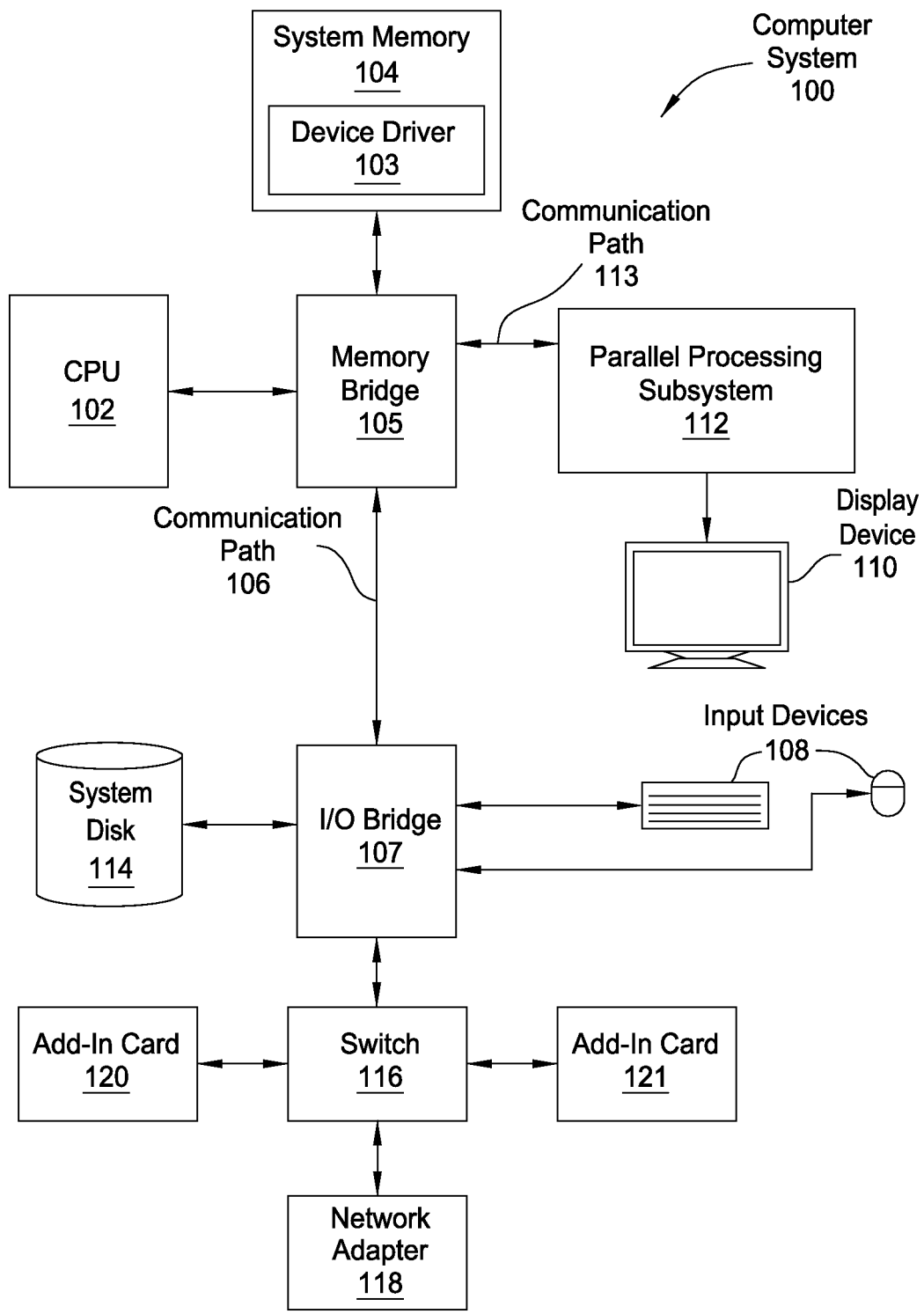
FIG. 1 is a conceptual illustration of a computer system configured to implement one or more aspects of the various embodiments.

FIG. 1 is a conceptual illustration of a computer system 100 configured to implement one or more aspects of the various embodiments. As shown, system 100 includes a central processing unit (CPU) 102 and a system memory 104 communicating via a bus path that may include a memory bridge 105. CPU 102 includes one or more processing cores, and, in operation, CPU 102 is the master processor of system 100, controlling and coordinating operations of other system components. System memory 104 stores software applications and data for use by CPU 102. CPU 102 runs software applications and optionally an operating system. Memory bridge 105, which may be, e.g., a Northbridge chip, is connected via a bus or other communication path (e.g., a HyperTransport link) to an I/O (input/output) bridge 107. I/O bridge 107, which may be, e.g., a Southbridge chip, receives user input from one or more user input devices 108 (e.g., keyboard, mouse, joystick, digitizer tablets, touch pads, touch screens, still or video cameras, motion sensors, and/or microphones) and forwards the input to CPU 102 via memory bridge 105.

A display processor 112 is coupled to memory bridge 105 via a bus or other communication path (e.g., a PCI Express, Accelerated Graphics Port, or HyperTransport link); in one embodiment display processor 112 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 104.

Display processor 112 periodically delivers pixels to a display device 110 (e.g., a screen or conventional CRT, plasma, OLED, SED or LCD based monitor or television). Additionally, display processor 112 may output pixels to film recorders adapted to reproduce computer generated images on photographic film. Display processor 112 can provide display device 110 with an analog or digital signal. In various embodiments, a graphical user interface is displayed to one or more users via display device 110, and the one or more users can input data into and receive visual output from the graphical user interface.

A system disk 114 is also connected to I/O bridge 107 and may be configured to store content and applications and data for use by CPU 102 and display processor 112. System disk 114 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 116 provides connections between I/O bridge 107 and other components such as a network adapter 118 and various add-in cards 120 and 121. Network adapter 118 allows system 100 to communicate with other systems via an electronic communications network, and may include wired or wireless communication over local area networks and wide area networks such as the Internet.

Other components (not shown), including USB or other port connections, film recording devices, and the like, may also be connected to I/O bridge 107. For example, an audio processor may be used to generate analog or digital audio output from instructions and/or data provided by CPU 102, system memory 104, or system disk 114. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

In one embodiment, display processor 112 incorporates circuitry optimized for graphics and video processing, including, for example, video output circuitry, and constitutes a graphics processing unit (GPU). In another embodiment, display processor 112 incorporates circuitry optimized for general purpose processing. In yet another embodiment, display processor 112 may be integrated with one or more other system elements, such as the memory bridge 105, CPU 102, and I/O bridge 107 to form a system on chip (SoC). In still further embodiments, display processor 112 is omitted and software executed by CPU 102 performs the functions of display processor 112.

Pixel data can be provided to display processor 112 directly from CPU 102. In some embodiments, instructions and/or data representing a scene are provided to a render farm or a set of server computers, each similar to system 100, via network adapter 118 or system disk 114. The render farm generates one or more rendered images of the scene using the provided instructions and/or data. These rendered images may be stored on computer-readable media in a digital format and optionally returned to system 100 for display. Similarly, stereo image pairs processed by display processor 112 may be output to other systems for display, stored in system disk 114, or stored on computer-readable media in a digital format.

Alternatively, CPU 102 provides display processor 112 with data and/or instructions defining the desired output images, from which display processor 112 generates the pixel data of one or more output images, including characterizing and/or adjusting the offset between stereo image pairs. The data and/or instructions defining the desired output images can be stored in system memory 104 or graphics memory within display processor 112. In an embodiment, display processor 112 includes 3D rendering capabilities for generating pixel data for output images from instructions and data defining the geometry, lighting shading, texturing, motion, and/or camera parameters for a scene. Display processor 112 can further include one or more programmable execution units capable of executing shader programs, tone mapping programs, and the like.

Further, in other embodiments, CPU 102 or display processor 112 may be replaced with or supplemented by any technically feasible form of processing device configured process data and execute program code. Such a processing device could be, for example, a central processing unit (CPU), a graphics processing unit (GPU), an application-specific integrated circuit (ASIC), a field-programmable gate array (FPGA), and so forth. In various embodiments any of the operations and/or functions described herein can be performed by CPU 102, display processor 112, or one or more other processing devices or any combination of these different processors.

CPU 102, render farm, and/or display processor 112 can employ any surface or volume rendering technique known in the art to create one or more rendered images from the provided data and instructions, including rasterization, scanline rendering REYES or micropolygon rendering, ray casting, ray tracing, image-based rendering techniques, and/or combinations of these and any other rendering or image processing techniques known in the art.

In other contemplated embodiments, system 100 may or may not include other elements shown in FIG. 1. System memory 104 and/or other memory units or devices in system 100 may include instructions that, when executed, cause the robot or robotic device represented by system 100 to perform one or more operations, steps, tasks, or the like.

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies display processor 112 is connected to I/O bridge 107 or directly to CPU 102, rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Edge Connector Pins without Tie Bars

Figure 2:
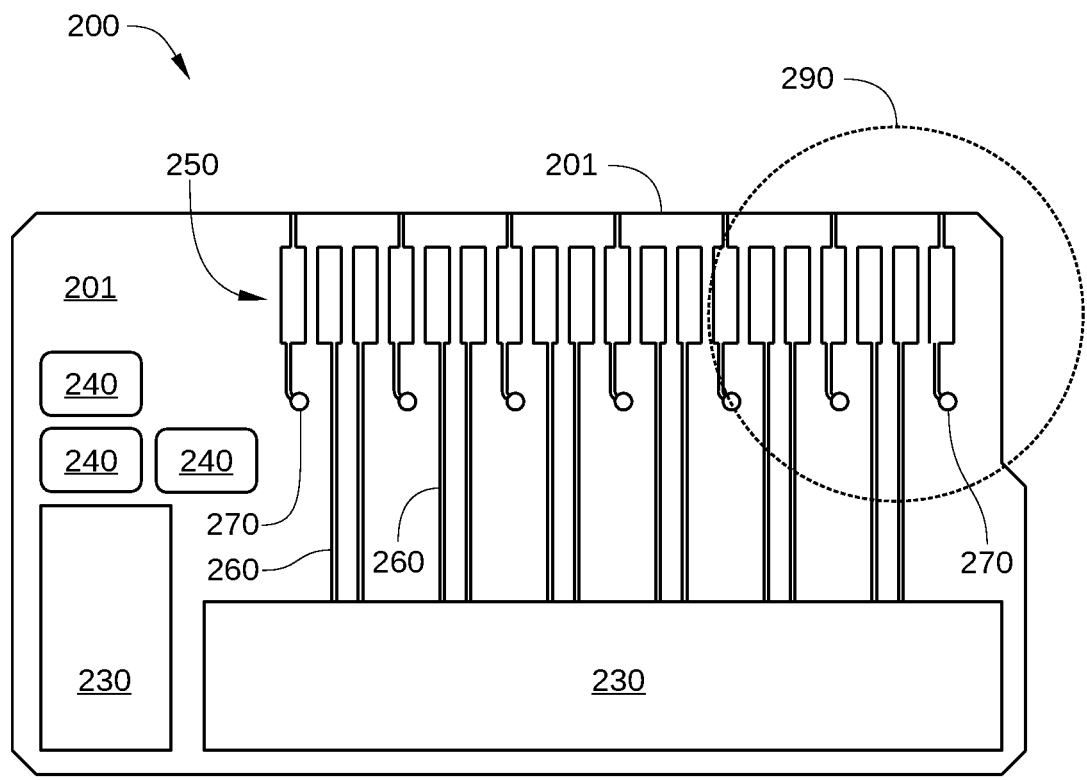
FIG. 2 is a schematic illustration of a printed circuit board, according to various embodiments.

FIG. 2 is a schematic illustration of a printed circuit board (PCB) 200 with multiple integrated circuits 230 and electronic devices 240 mounted thereon, according to various embodiments. In some embodiments, one or more a functional modules of computer system 100 of FIG. 1 can be implemented as a PCB-based module using an embodiment of PCB 200. In such embodiments, functional modules of computer system 100 so implemented include CPU 102, system memory 104, display processor 112, network adapter 118, and/or add-in cards 120 and 121. In some embodiments, multiple functional modules of computer system 100 are mounted on a single PCB 200. Alternatively or additionally, in some embodiments, a single functional module of computer system 100 is mounted on a single PCB 200. PCB 200 includes a substrate 201 on which integrated circuits 230 and electronic devices 240 are mounted. PCB further includes a plurality of edge connector pins 250 formed on an edge 201 of PCB 200.

Substrate 201 is a rigid and electrically insulating substrate on which integrated circuits 230 and electronic devices 240 are mounted that provides PCB 200 with structural rigidity. Thus, substrate 201 enables PCB 200 to be removed from and inserted into a suitable interface or slot, such as a peripheral component interconnect express (PCIe) slot of a motherboard or the like. In some embodiments, substrate 201 is a laminate substrate and is composed of a stack of insulative layers or laminates that are built up on the top and bottom surfaces of a core layer. Substrate 201 can include any materials suitable for use in a PCB, including a phenolic paper substrate (e.g., FR-2, an epoxy paper substrate (e.g., CEM-1 and/or FR-3), an epoxy fiberglass board (e.g., FR-4, FR-5, G-10, and/or G-11), a non-woven glass fiber polyester substrate (e.g., FR-6), a PI polyacrylamide resin base material, and/or the like.

Substrate 201 also provides an electrical interface, via electrical traces 260 and vias 270, for routing input and output signals, power, and ground connections between integrated circuits 230, electronic devices 240, and/or edge connector pins 250. Electrical traces 260 and vias 270 can be formed with any conventional conductive material deposition processes. Electrical traces 260 may be formed in multiple layers of PCB 200, and vias 270 are configured to connect electrical traces 260 that are formed in different layers of PCB 200. Vias 270 may include through-hole vias and/or buried vias.

Edge connector pins 250 provide electrical connections between the integrated circuits 230 and electronic devices 240 of PCB 200 and other devices external to PCB 200, such as other PCB-based modules (not shown) of a computing device that includes PCB 200. For example, such PCB-based modules may include one or more sound cards, graphics cards, network interface cards, and/or the like. According to various embodiments, and as described in greater detail below, edge connector pins 250 include signal-carrying connector pins that are not coupled to or include a tie bar stub, and therefore transmit high-frequency signals with higher signal integrity than conventional signal-carrying edge connector pins.

Integrated circuits 230 may include one or more processors, memory devices, a solid state drive (SSD), an SOC, and/or the like. The processor or processors can be a high-powered processor, such as CPU 102 and/or display processor 112 of FIG. 1, or any other technically feasible processor or integrated circuit. Electronic devices 240 may include one or more power regulators or other power-supplying devices. Alternatively or additionally, in some embodiments, electronic devices 240 include other electronic devices mounted on PCB 200, such as capacitors, resistors, and/or the like. Integrated circuits 230 and/or electronic devices 240 may be coupled to electrical traces 260 and/or vias 270 by any technically feasible electrical connection known in the art, including a ball-grid array (BGA), a pin-grid array (PGA), wire bonding, and/or the like.

A region 290 that includes edge connector pins 250 of PCB 200 is described below in conjunction with FIG. 3.

Figure 3:
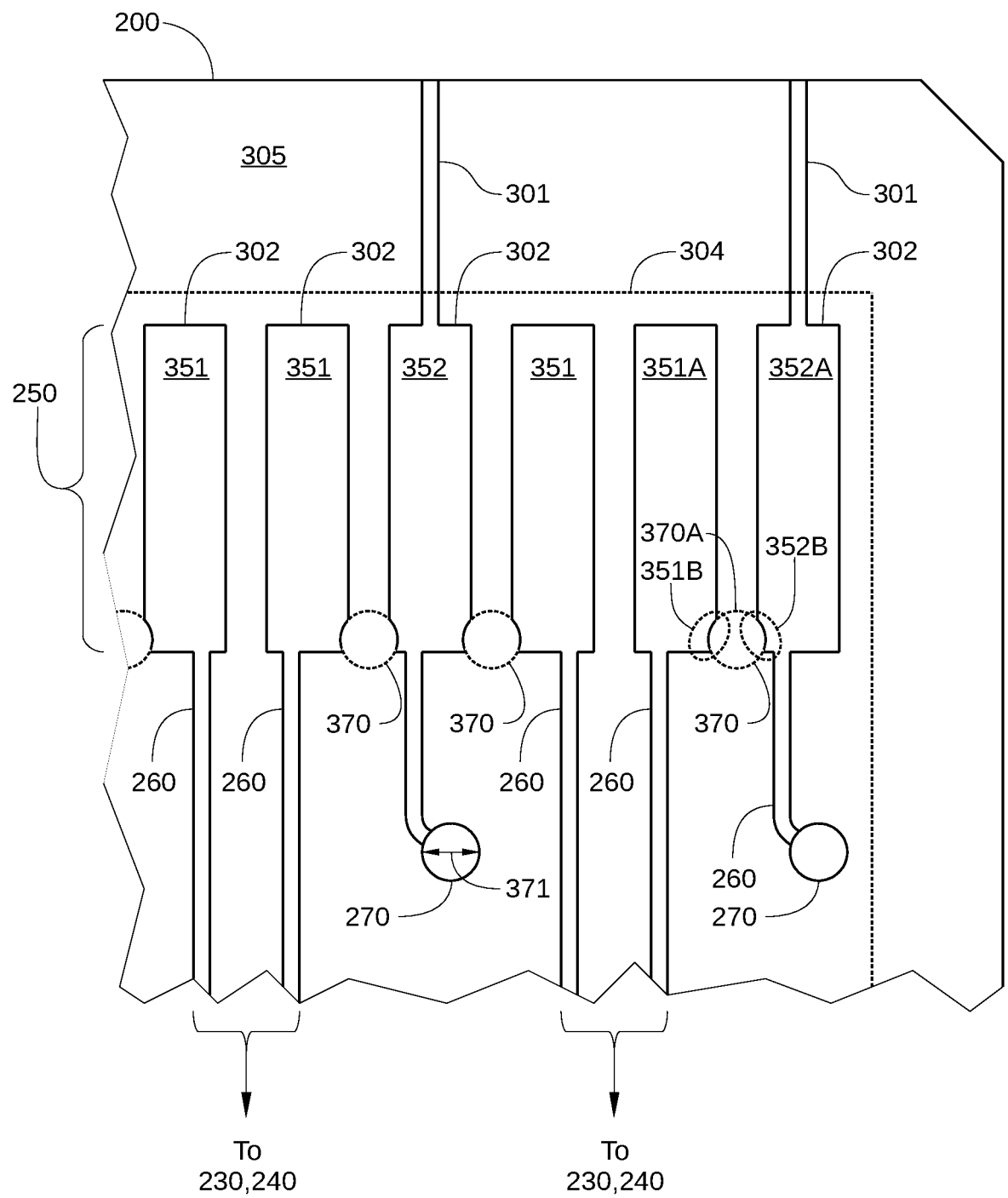
FIG. 3 is a more detailed illustration of a region of the printed circuit board of FIG. 2, according to various embodiments.

FIG. 3 is a more detailed illustration of PCB 200, according to various embodiments. In the embodiment illustrated in FIG. 3, PCB 200 includes edge connector pins 250 that are configured as signal-carrying edge connector pins 351 and edge connector pins that are configured as non-signal-carrying edge connector pins 352.

Signal-carrying edge connector pins 351 are each configured to carry electrical signals (e.g., input/output signals) to or from integrated circuits 230 and/or electronic devices 240 when PCB 200 is in operation. In some embodiments, signal-carrying edge connector pins 351 are electrically coupled to integrated circuits 230 and/or electronic devices 240 (not shown in FIG. 3) via one or more electrical traces 260 and/or vias 270. As shown in FIG. 3, after fabrication of PCB 200 is complete, signal-carrying edge connector pins 351 are not directly connected to a tie-bar stub 301. Thus, in the embodiment illustrated in FIG. 3, no tie bar stubs 301 extend from an end edge 302 (or any other edge) of a signal-carrying edge connector pin 351.

Non-signal-carrying edge connector pins 352 are not configured to carry electrical signals to or from integrated circuits 230 and/or electronic devices 240. Instead, non-signal-carrying edge connector pins 352 are configured to provide ground or power to integrated circuits 230 and/or electronic devices 240 when PCB 200 is in operation. In some embodiments, non-signal-carrying edge connector pins 352 are electrically coupled to a ground plane 304 or power plane (not shown) disposed within PCB 200 by one or more vias 270. Because ground plane 304 is formed as an internal layer of PCB 200, ground plane 304 is shown in dashed lines.

In the embodiment illustrated in FIG. 3, a tie bar stub 301 extends from an end edge 302 (or any other suitable edge) of each non-signal-carrying edge connector pin 352. As described below in conjunction with FIGS. 4 and 5A-5C, tie bar stubs 301 are artifacts of a fabrication process described herein, according to various embodiments. For example, in some embodiments, each tie bar stub 301 includes a copper layer onto which a gold electroplated layer is formed via an electroplating process. During the gold electroplating process, tie bar stubs 301 are operable as plating current conductors that apply a plating bias to non-signal-carrying edge connector pins 352. Thus, during the gold electroplating process, a plating current is transmitted to non-signal-carrying edge connector pins 352 to enable the gold electroplating of edge connector pins 250.

In the embodiment illustrated in FIG. 3, PCB 200 further includes drilled holes 370 formed in an electrically insulating layer 305 of PCB 200 on which edge connector pins 250 are formed. Drilled holes 370 are artifacts of a fabrication process described herein, according to various embodiments. As shown, each drilled hole 370 is disposed between two adjacent edge connector pins 250, and forms a portion of an edge of each of the two adjacent edge connector pins. For example, in the embodiment illustrated in FIG. 3, drilled hole 370A is disposed between a signal-carrying edge connector pin 351A and a non-signal-carrying edge connector pin 352A, and forms a portion 351B of an edge of signal-carrying edge connector pin 351A and a portion 352B of an edge of non-signal-carrying edge connector pin 352A.

In some embodiments, drilled holes 370 are partially or completely back-filled with an electrically insulating material (not shown for clarity) after a gold electroplating process and prior to completion of the fabrication of PCB 200. Alternatively, in some embodiments, drilled holes 370 are not back-filled with an electrically insulating material during fabrication of PCB 200.

In some embodiments, drilled holes 370 are formed using a mechanical drilling process, such as a process employed for drilling vias 270. Alternatively or additionally, in some embodiments, drilled holes 370 are formed using any other technically feasible approach for drilling vias 270, such as a laser drilling process. In some embodiments, drilled holes 370 have a diameter 371 that is equal to the diameter of vias 270.

Forming Electroplated Edge Connector Pins

Figure 4:
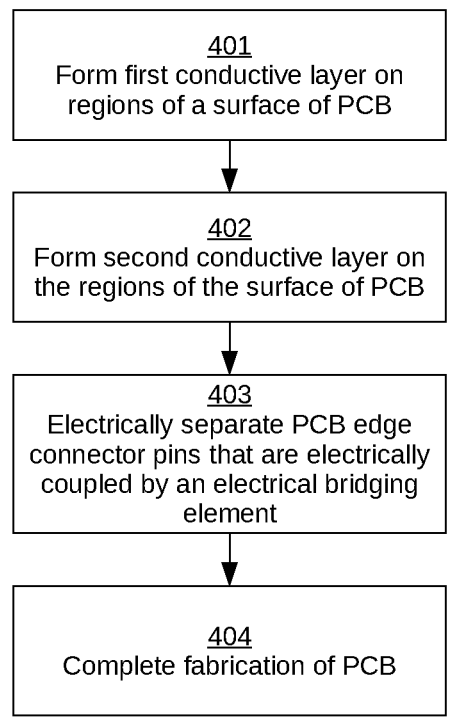
FIG. 4 sets forth a flowchart of method steps for forming the electroplated edge connector pins of a printed circuit board, according to various embodiments.
Figure 5A:
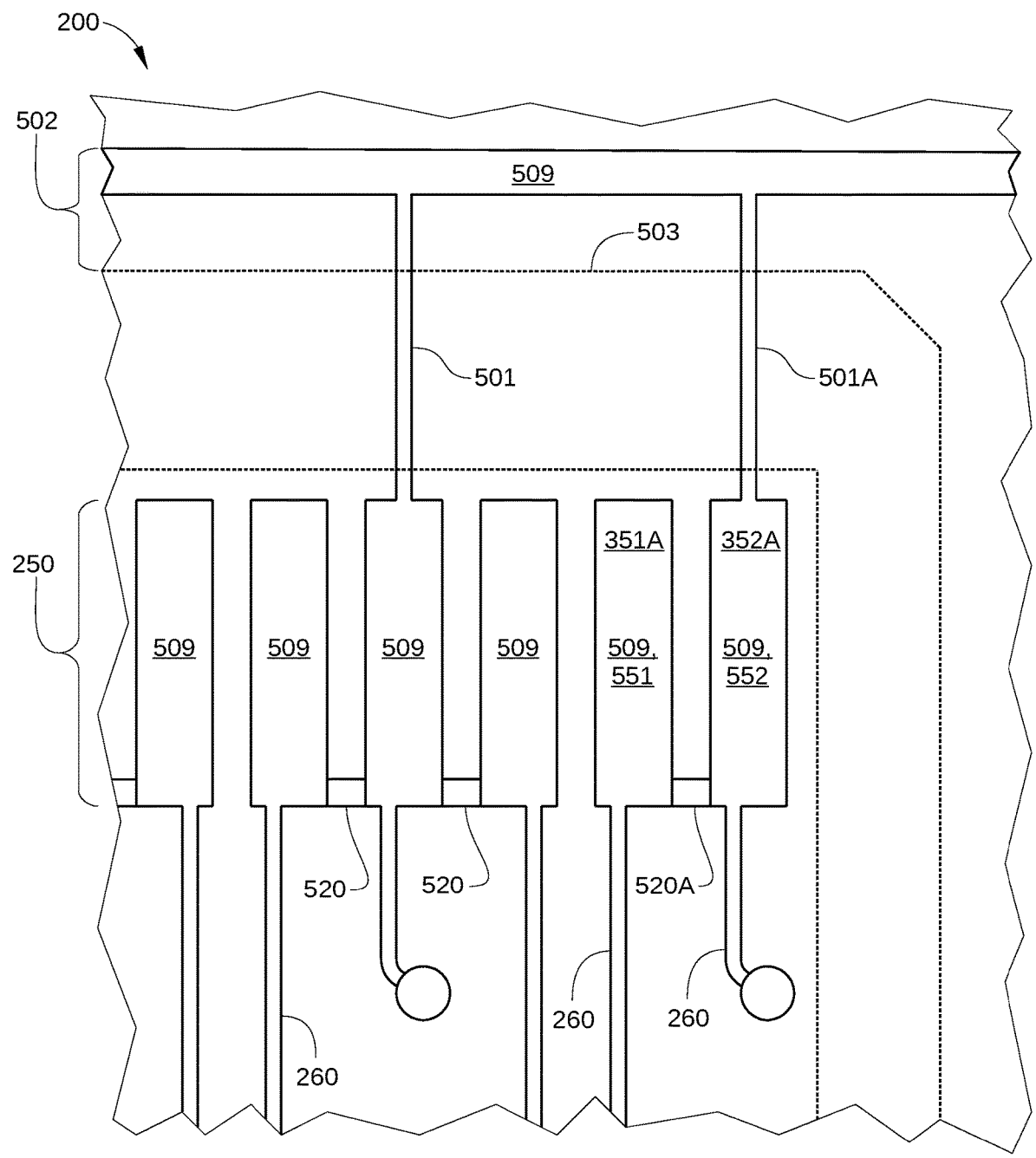
FIG. 5A illustrates the printed circuit board of FIG. 2 after step 401 of FIG. 4 has been completed, according to various embodiments.
Figure 5B:
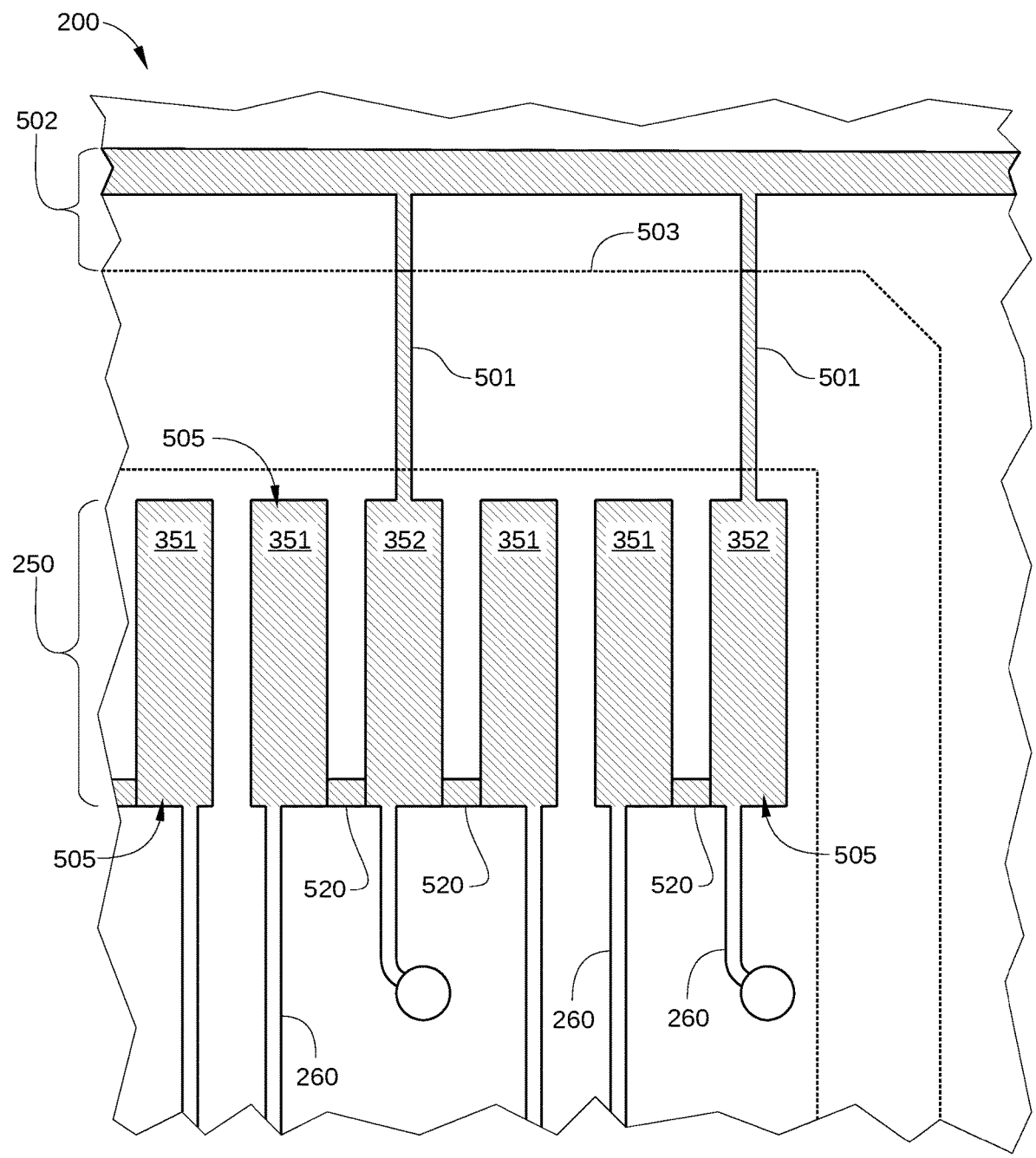
FIG. 5B illustrates the printed circuit board of FIG. 2 after step 402 of FIG. 4 has been completed, according to various embodiments.
Figure 5C:
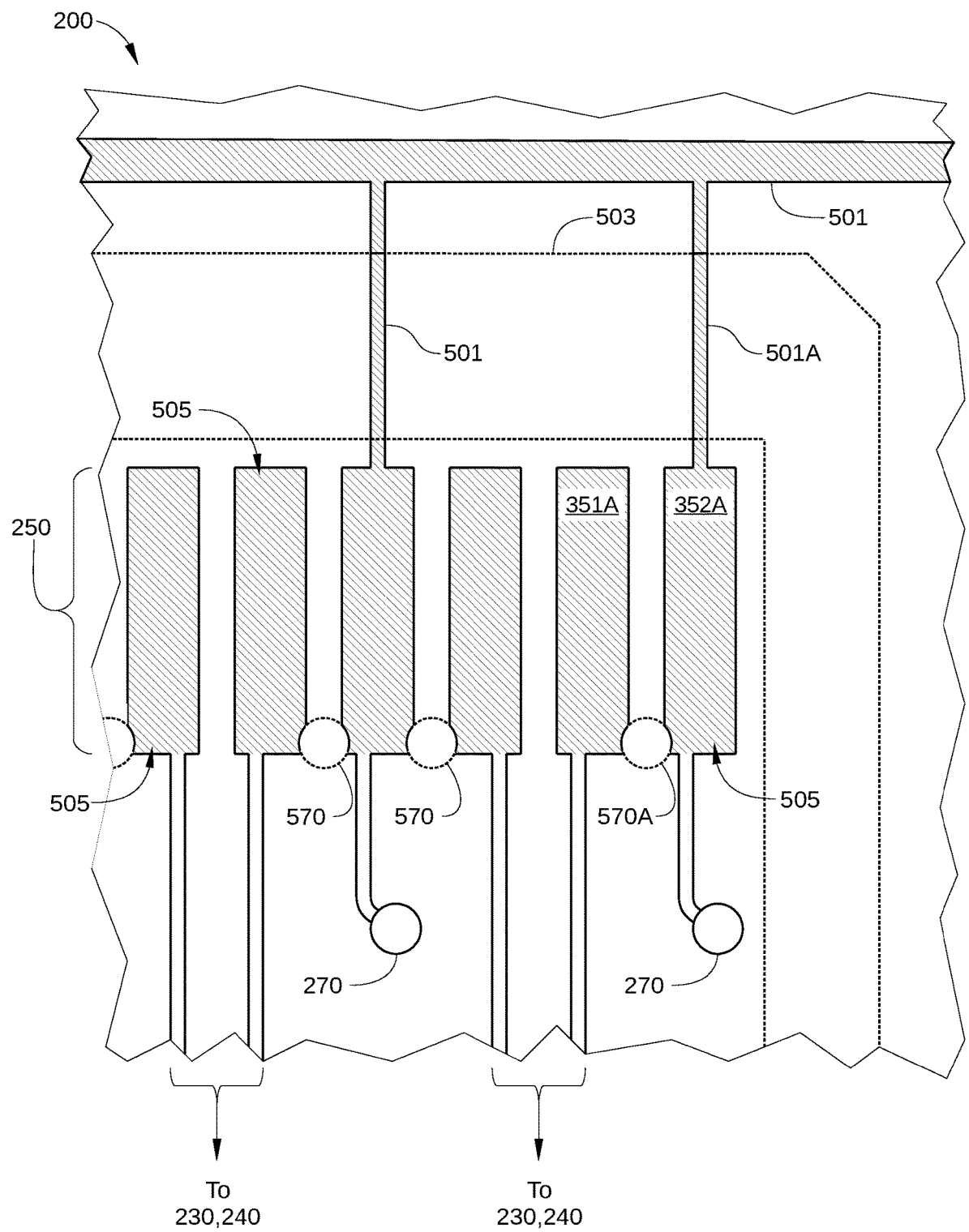
FIG. 5C illustrates the printed circuit board of FIG. 2 after step 403 of FIG. 4 has been completed, according to various embodiments.

FIG. 4 sets forth a flowchart of method steps for forming electroplated edge connector pins of PCB 200, according to various embodiments. FIG. 5A illustrates PCB 200 after completion of method step 401, according to various embodiments; FIG. 5B illustrates PCB 200 after completion of method step 402, according to various embodiments; and FIG. 5C illustrates PCB 200 after completion of method step 403, according to various embodiments. Although the method steps are described with respect to PCB 200 of FIGS. 1-3, any PCB that is configured with edge connector pins falls within the scope of the various embodiments. Further, although the method steps are illustrated in a particular order, the method steps may be performed in parallel, and/or in a different order than those described herein. Also, the various method steps may be combined into fewer blocks, divided into additional blocks, and/or eliminated based upon a particular implementation.

As shown, a method 400 begins at step 401, in which a first conductive layer 509 is formed on multiple regions of a surface of PCB 200, such as a copper-containing layer. Specifically, first conductive layer 509 is formed for edge connector pins 250, one or more plating current conductors 501, and one or more electrical bridging elements 520, as shown in FIG. 5A. In some embodiments, first conductive layer 509 is formed for some or all of the above-described regions of the surface of PCB 200 concurrently, for example via single metal layer deposition process. In such embodiments, edge connector pins 250, the one or more plating current conductors 501, and/or the one or more electrical bridging elements 520 may be formed on or within the same layer of PCB 200. In other embodiments, edge connector pins 250, the one or more plating current conductors 501, and/or the one or more electrical bridging elements 520 may be formed on or within different layers of PCB 200. Generally, any technically feasible metal deposition process or processes may be employed in step 401 to deposit first conductive layer 509.

In some embodiments, some or all of electrical traces 260 are also formed during step 401, and in other embodiments, some or all of electrical traces 260 are formed in PCB 200 via a different process or processes than first conductive layer 509.

Plating current conductors 501 are configured to enable an electroplating bias to be applied to metallic portions of PCB 200 that are electrically coupled to at least one plating current conductor 501. As a result, during an electroplating process (described below in step 402), a second conductive layer can be electroplated onto such metallic portions. For example, in the embodiment illustrated in FIG. 5A, metallic portions of PCB 200 that can have an electroplating bias applied thereto include first conductive layer 509 formed for edge connector pins 250 and the one or more electrical bridging elements 520.

In the embodiment illustrated in FIG. 5A, plating current conductors 501 include one or more portions 502 that extend beyond a footprint (or perimeter) 503 of PCB 200. Thus, in such embodiments, portions 502 of plating current conductors 501 that are disposed outside footprint 503 (dashed line) of PCB 200 are not included in PCB 200 when fabrication of PCB 200 is complete. Instead, when PCB 200 is cut down to footprint 503, portions 502 are discarded.

Electrical bridging elements 520 are configured to electrically couple two adjacent edge connector pins 250 during the electroplating process of step 402. For example, in the embodiment illustrated in FIG. 5A, an electrical bridging element 520A is formed to electrically couple a first conductive layer 551 of signal-carrying edge connector pin 351A with a first conductive layer 552 of non-signal-carrying edge connector pin 352A. Thus, during an electroplating process in which a plating bias is applied to first conductive layer 552 of non-signal-carrying edge connector pin 352A, first conductive layer 551 of signal-carrying edge connector pin 351A also has a plating bias applied thereto, via electrical bridging element 520A, signal-carrying edge connector pin 352A, and a plating current conductor 501A.

In step 402, a second conductive layer 505 (cross-hatched) is formed on multiple regions of PCB 200 via an electroplating process. In step 402, second conductive layer 505 is formed on regions of PCB 200 that include an exposed metal surface that has an electroplating bias applied thereto. Thus, in the embodiment illustrated in FIG. 5B, second conductive layer 505 is formed on first conductive layer 509 formed in step 401 for edge connector pins 250, one or more plating current conductors 501, and one or more electrical bridging elements 520. It is noted that in FIG. 5B, first conductive layer 509 formed in step 401 for edge connector pins 250 and plating current conductors 501 is not visible.

In some embodiments, second conductive layer 505 is formed for some or all of the above-described regions of the surface of PCB 200 concurrently, for example via a single electroplating process. Generally, any technically feasible electroplating process or processes may be employed in step 402 to deposit second conductive layer 505. In some embodiments, portions 502 of plating current conductors 501 are masked prior to step 402. In such embodiments, the second conductive layer is not formed on portions 502, since portions 502 are not exposed during the electroplating process.

In step 403, edge connector pins 250 that are electrically coupled by an electrical bridging element 520 are electrically separated. In some embodiments, such edge connector pins are electrically separated by the removal of at least a portion of an adjacent electrical bridging element 520. In some embodiments, a drilling process is employed in step 403 that removes some or all of bridging elements 520, forming a drilled hole 570 between such electrically coupled edge connector pins 250. For example, in the embodiment illustrated in FIG. 5C, drilled hole 570A is formed between signal-carrying edge connector pin 351A and non-signal-carrying edge connector pin 352A. In some embodiments, a mechanical drilling operation is performed in step 403 to form drilled holes 570. Alternatively or additionally, in some embodiments, drilled holes 570 are formed using any other technically feasible approach, such as a laser drilling process.

In step 404, fabrication of PCB 200 is completed using conventional fabrication approaches. For example, in some embodiments, PCB 200 is cut out of a panel (not shown) of multiple PCBs along footprint 503, cleaned, tested, and packaged. Further, in some embodiments, one or more of drilled holes 570 are back-filled with an electrically insulating material, such as an epoxy resin.

Implementation of method 400 enables signal-carrying edge connector pins 250 of PCB 200 to be formed without a tie bar stub, since plating current conductors 501 are not directly coupled to signal-carrying edge connector pins 250. Instead, the plating current conductors 501 are coupled to non-signal-carrying edge connector pins 250, such as ground edge connector pins.

In the embodiment illustrated in FIGS. 5A-5C, each non-signal-carrying edge connector pin of PCB 200 is configured to be electrically coupled to a plating current conductor 501 and, via electrical bridging elements 520, to adjacent signal-carrying edge connector pins of PCB 200. In other embodiments, any other technically feasible configuration of plating current conductors 501 and electrical bridging elements 520 can be employed to enable an electroplating current to be applied to all edge connector pins 250 of PCB 200 during an electroplating process. For example, in some embodiments, a portion of non-signal-carrying edge connector pins are not electrically coupled to a plating current conductor 501. In such embodiments, an electroplating current is applied to such non-signal-carrying edge connector pins via electrical bridging elements 520 and an adjacent edge connector pin 250.

Ground-Plane as Plating Current Conductor

In some embodiments, a ground plane of a PCB is employed as a plating current conductor during an electroplating process. In such embodiments, a plating current conductor is electrically coupled to the ground plane instead of to one or more non-signal-carrying edge connector pins. One such embodiment is described below in conjunction with FIGS. 6 and 7A-7E.

FIG. 6 sets forth a flowchart of method steps for forming electroplated edge connector pins of a PCB 700, according to various embodiments. Each of FIGS. 7A-7F illustrates PCB 700 after the completion of method steps 601-605, respectively, according to an embodiment. Although the method steps are described with respect to the PCB of FIGS. 7A-7F, any PCB that is configured with edge connector pins falls within the scope of the various embodiments. Further, although the method steps are illustrated in a particular order, the method steps may be performed in parallel, and/or in a different order than those described herein. Also, the various method steps may be combined into fewer blocks, divided into additional blocks, and/or eliminated based upon a particular implementation.

Figure 7A:
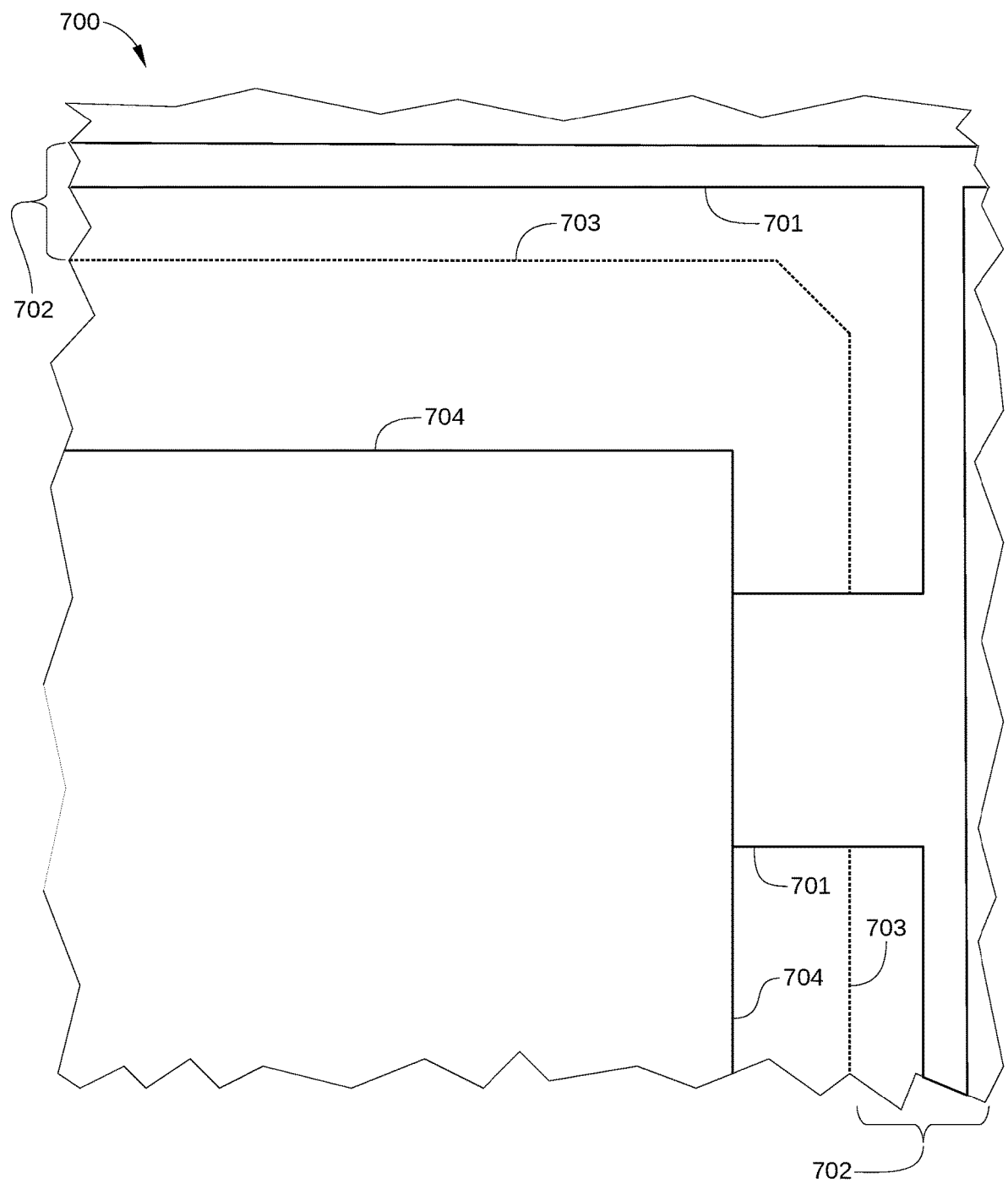

As shown, a method 600 begins at step 601, in which a plating current conductor 701 and a ground plane 704 are formed, as shown in FIG. 7A. Plating current conductor 701 and ground plane 704 can be configured as any metallic structure, layer or interconnect suitable for use in PCB 700. In some embodiments, plating current conductor 701 and ground plane 704 are formed concurrently with the same metal layer deposition process. Thus, in such embodiments, plating current conductor 701 and ground plane 704 are formed from the same material. It is noted that portions 702 of plating current conductor 701 that are disposed outside a footprint 703 (dashed line) of PCB 700 are not included in PCB 700 when fabrication of PCB 700 is complete. Instead, when PCB 700 is cut down to footprint 703, portions 702 are discarded.

Figure 7B:
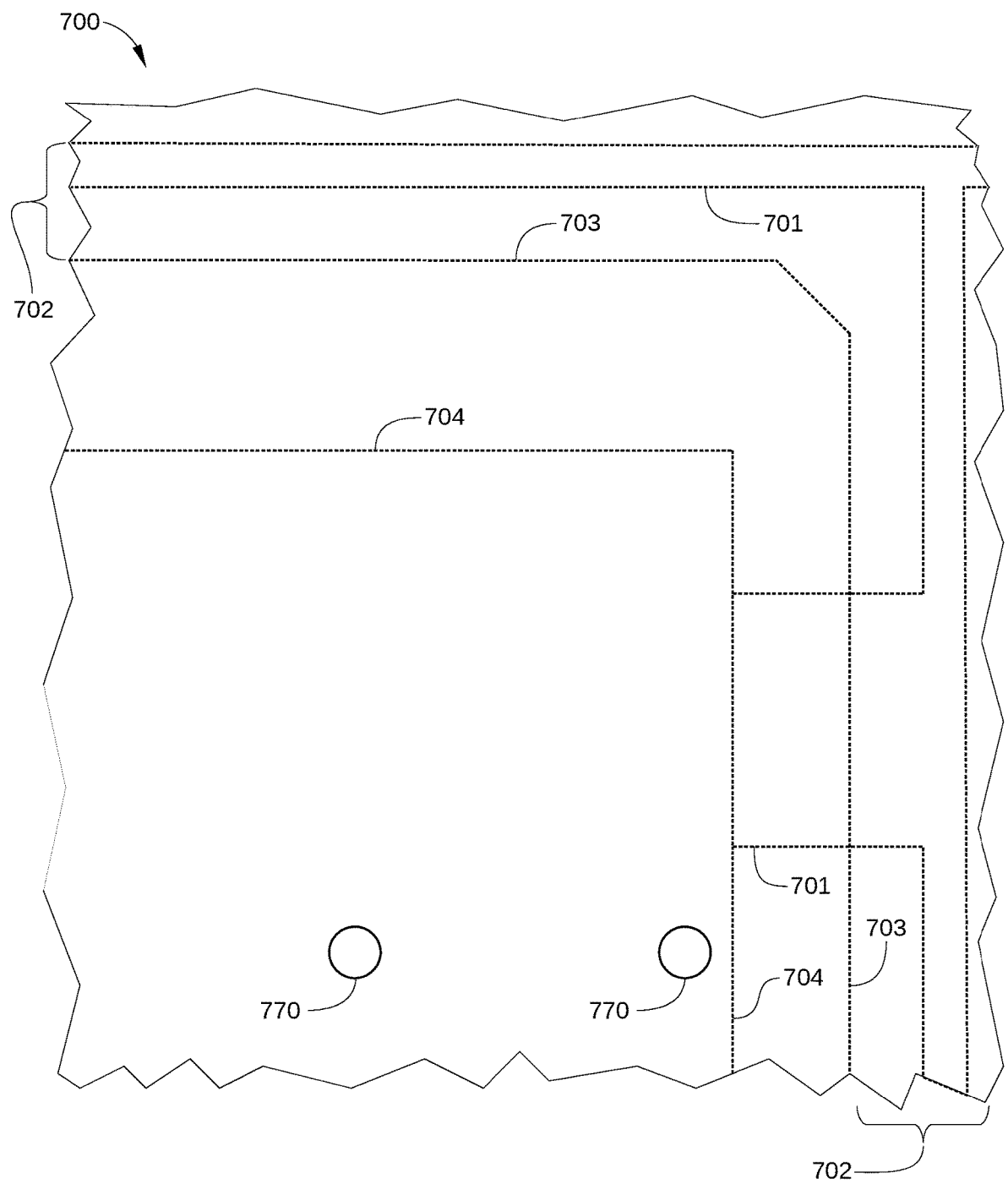

In step 602, vias 770 are formed in PCB 700, as shown in FIG. 7B. Vias 770 include one or more vias that are electrically coupled to ground plane 704 and plating current conductor 701. In some embodiments, vias 770 can also include other vias that are not electrically coupled to ground plane 704 or plating current conductor 701. Further, prior to via formation, one or more electrically insulating layers are also formed in PCB 700, partially or completely covering ground plane 704 and/or plating current conductor 704.

Figure 7C:
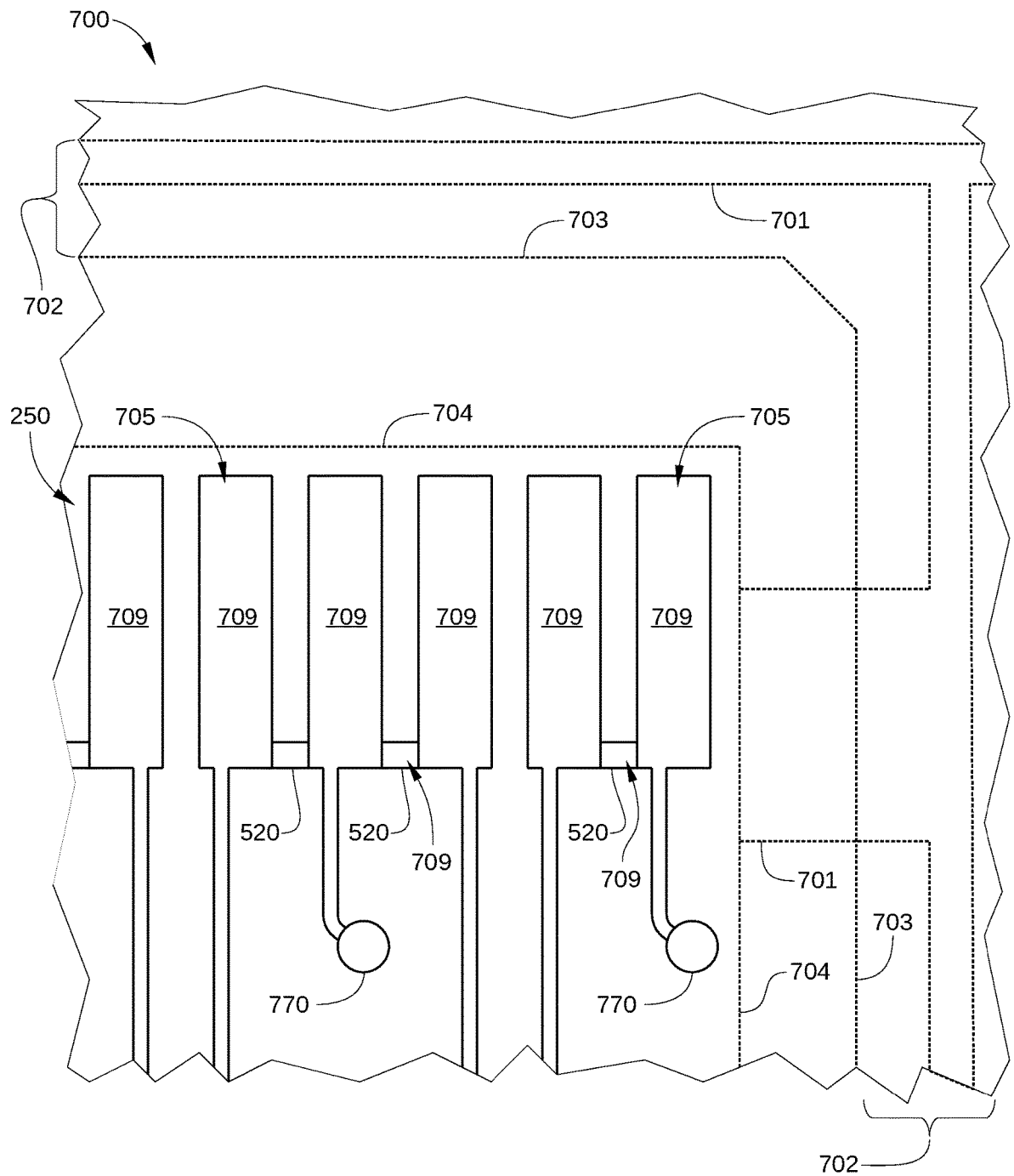

In step 603, a first conductive layer 709 is formed on multiple regions of a surface of PCB 700, such as a copper-containing layer. Specifically, first conductive layer 709 is formed for edge connector pins 250 and one or more electrical bridging elements 520, as shown in FIG. 7C. In some embodiments, step 603 is substantially similar to step 401 of FIG. 4.

Figure 7D:
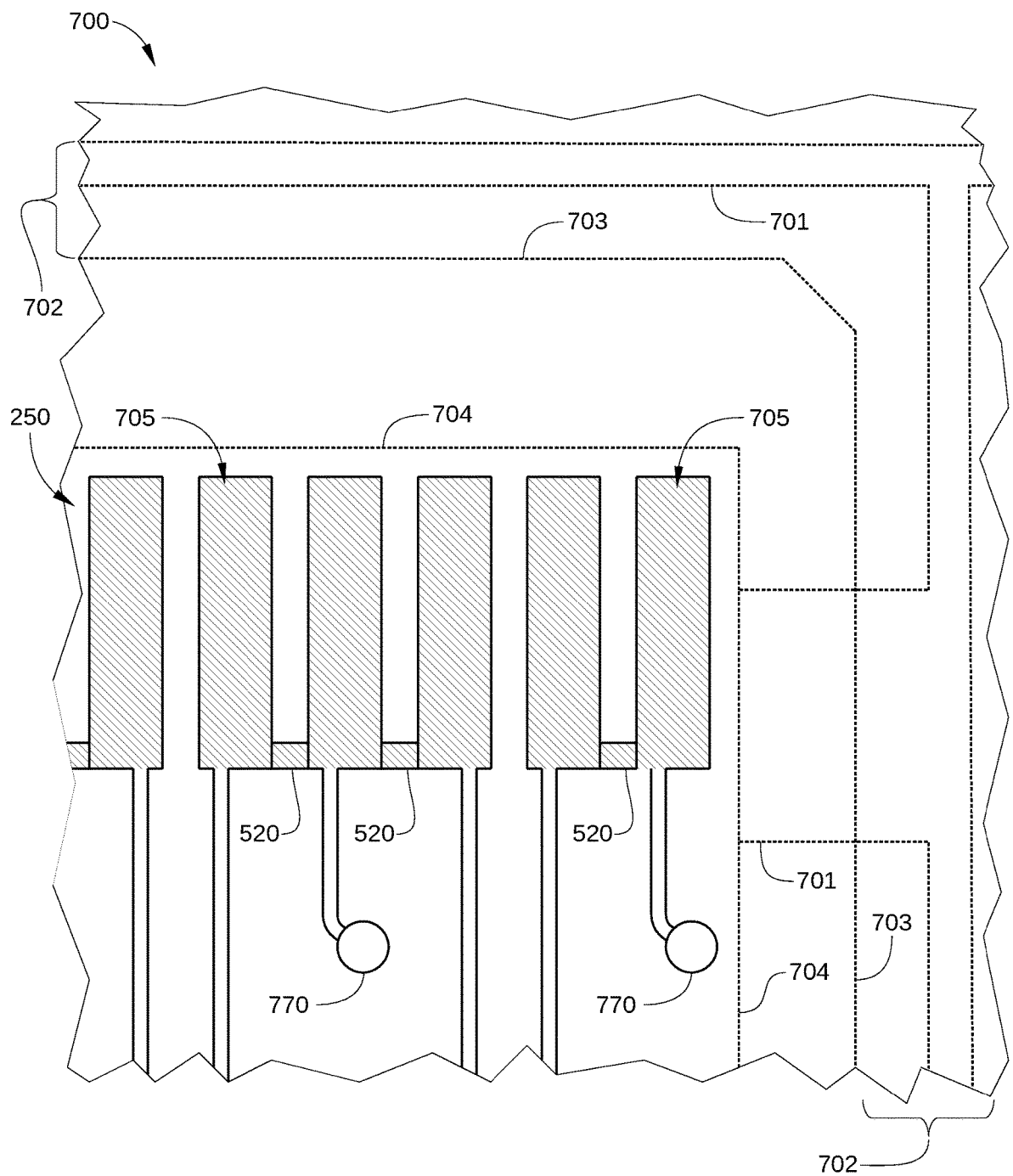

In step 604, a second conductive layer 705 (cross-hatched) is formed on multiple regions of PCB 700 via an electroplating process, as shown in FIG. 7D. For example, in some embodiments, second conductive layer 705 includes a gold-containing electroplated layer. In some embodiments, step 604 is substantially similar to step 402 of FIG. 4. However, unlike step 402, in step 604, electroplating bias is applied to first conductive layer 709 (not visible in FIG. 7D) via plating current conductor 701, ground plane 704, one or more vias 770, and one or more electrical bridging elements 520.

Figure 7E:
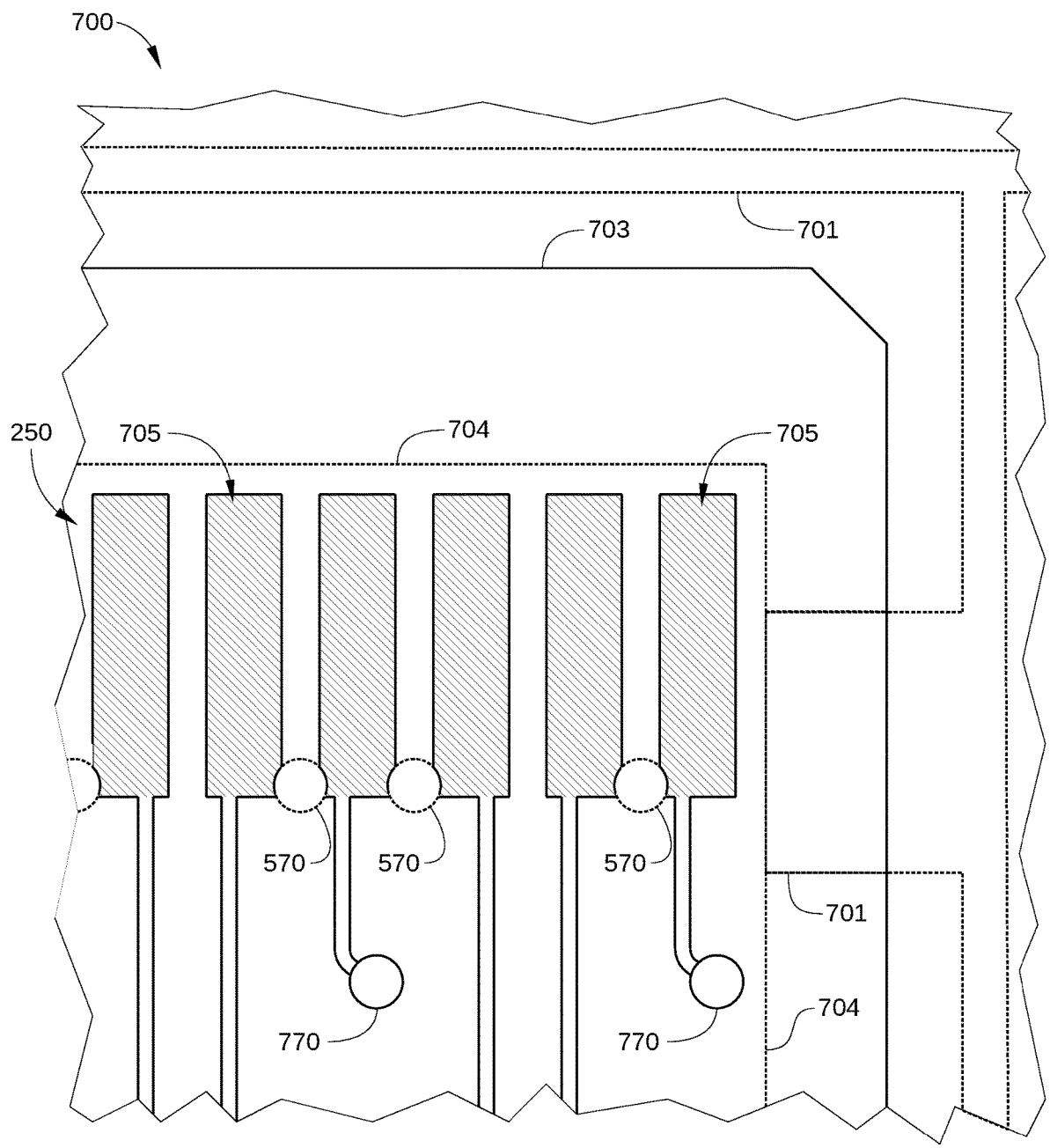

In step 605, edge connector pins 250 that are electrically coupled by an electrical bridging element 520 are electrically separated, as shown in FIG. 7E. In some embodiments, step 605 is substantially similar to step 403 of FIG. 4, where some or all of electrical bridging elements 520 are removed by a mechanical drilling process, a laser drilling process, and/or the like. In such embodiments, drilled holed 570 are formed.

Figure 7F:
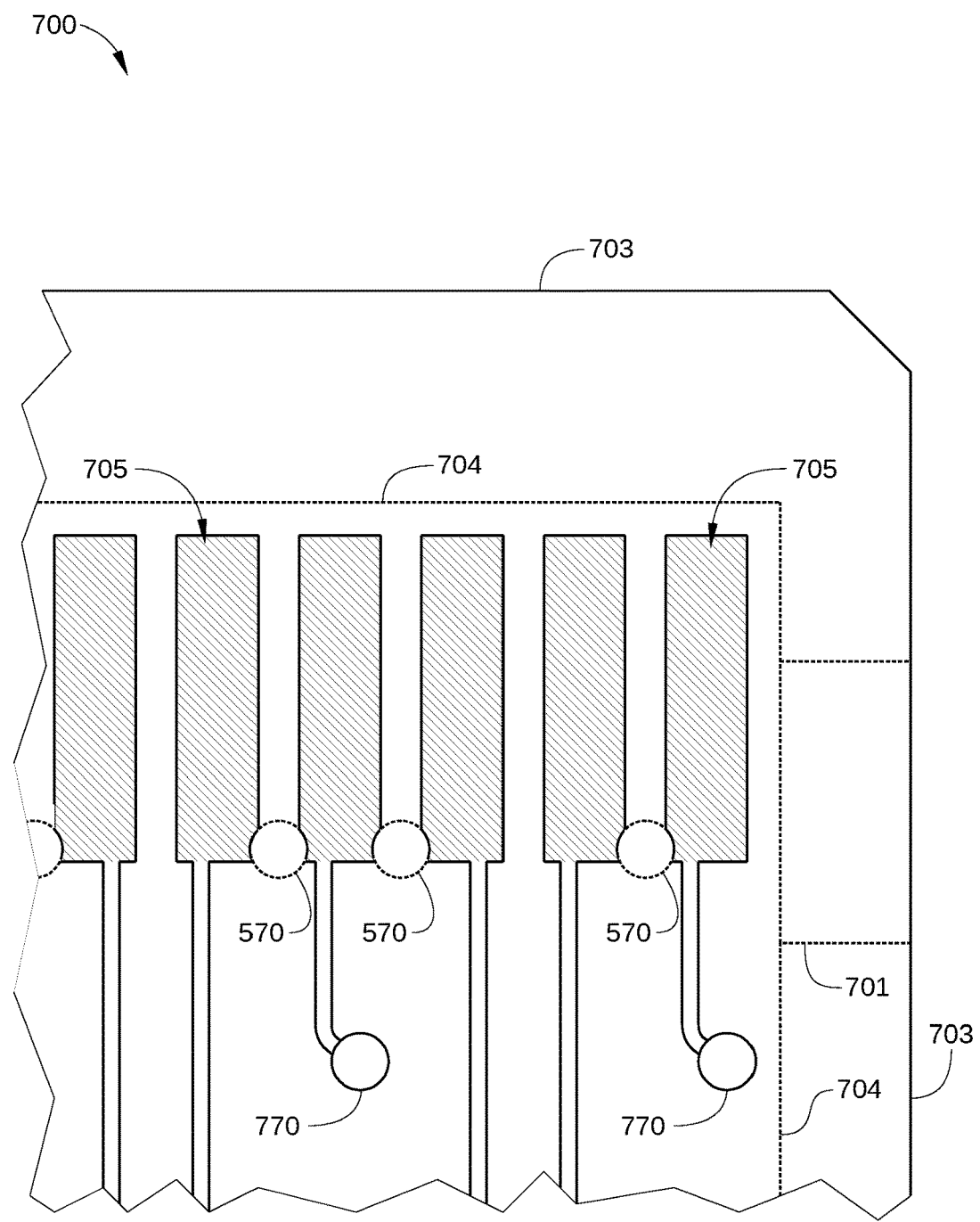

In step 606, fabrication of PCB 700 is completed using conventional fabrication approaches. For example, in some embodiments, PCB 700 is cut out of a panel (not shown) of multiple PCBs along footprint 703, as shown in FIG. 7F. Further, in some embodiments, one or more of drilled holes 570 are back-filled with an electrically insulating material, such as an epoxy resin.

In sum, the various embodiments shown and provided herein set forth techniques for forming electroplated edge connector pins in a PCB. Specifically, an electrical bridging element is formed to electrically couple a signal-carrying edge connector pin to a non-signal-carrying edge connector pin, thereby enabling application of an electroplating bias to the signal-carrying edge connector pin without the use of a conventional tie bar. After the electroplating process, some or all of the electrical bridging element is removed, so that the signal-carrying edge connector pin is no longer electrically coupled to the non-signal-carrying edge connector pin.

At least one technical advantage of the disclosed techniques relative to the prior art is that the disclosed techniques enable edge connector pins of PCBs to be formed without tie bar stubs. Consequently, the integrity of the data and communication signals transmitted through the edge connector pins formed using the disclosed techniques is not degraded by the noise oftentimes resulting from tie bar-related capacitance and signal reflection. A further advantage of the disclosed techniques is that additional chemical etching and cleaning processes are not required to form the edge connector pins having no tie bar stubs. Thus, the complexity of those additional chemical etching and cleaning processes is avoided. These technical advantages provide one or more technological advancements over prior art approaches.

1. In some embodiments, a method for forming a printed circuit board includes: forming on a substrate a first conductive layer for a first edge connector pin and a first conductive layer for a second edge connector pin, wherein the first conductive layer for the first edge connector pin and the first conductive layer for the second edge connector pin are electrically coupled to one another via a first conductive layer for an electrical bridging element; electroplating a second conductive layer onto both the first conductive layer for the first edge connector pin and the first conductive layer for the second edge connector pin via a plating current conductor; and removing at least a portion of the electrical bridging element to electrically separate the first edge connector pin from the second edge connector pin.

2. The method of clause 1, wherein removing the at least a portion of the electrical bridging element comprises performing a mechanical drilling operation on the electrical bridging element.

3. The method of clauses 1 or 2, wherein the first conductive layer for the first edge connector pin, the second edge connector pin, and the electrical bridging element are formed on a same surface of the substrate.

4. The method of any of clauses 1-3, wherein electroplating the second conductive layer onto both the first conductive layer for the first edge connector pin and the first conductive layer for the second edge connector pin comprises applying a plating bias to both the first edge connector pin and the second edge connector pin via the plating current conductor.

5. The method of any of clauses 1-4, wherein at least a portion of the plating current conductor is disposed outside a perimeter of the printed circuit board.

6. The method of any of clauses 1-5, wherein the first edge connector pin is configured as a non-signal-carrying connector pin, and the second edge connector pin is configured as a signal-carrying connector pin.

7. The method of any of clauses 1-6, wherein a first conductive layer for the plating current conductor is coupled directly to the first conductive layer for the first edge connector pin and is coupled indirectly to the first conductive layer for the second edge connector pin.

8. The method of any of clauses 1-7, wherein a first conductive layer of the plating current conductor is electrically coupled to the first conductive layer for the first edge connector pin via a ground plane of the printed circuit board.

9. The method of any of clauses 1-8, wherein a first conductive layer for the first edge connector pin is electrically coupled to a ground plane of the printed circuit board by at least one via of the printed circuit board.

10. The method of any of clauses 1-9, wherein forming the first conductive layer for the first edge connector pin on the substrate comprises concurrently forming a ground plane of the printed circuit board.

11. The method of any of clauses 1-10, wherein forming the first conductive layer for the first edge connector pin on the substrate comprises concurrently forming a first conductive layer for the electrical bridging element and a first conductive layer for the plating current conductor.

12. The method of any of clauses 1-11, wherein electrically separating the first edge connector pin from the second edge connector pin is performed after electroplating the second layer onto the first conductive layer of the first edge connector pin and the first conductive layer of the second edge connector pin.

13. In some embodiments, a printed circuit board includes: a laminate substrate that includes at least one electrically insulating later; a plurality of edge connector pins that are formed on the at least one electrically insulating layer and includes: a first edge connector pin that is configured as a ground connector pin and is coupled to a tie bar stub; and a second edge connector pin that is configured as a signal connector pin and is not coupled to a tie bar stub.

14. The printed circuit board of clause 13, wherein the first edge connector pin is adjacent to the second edge connector pin.

15. The printed circuit board of clauses 13 or 14, further comprising a third edge connector pin that is included in the plurality of edge connector pins, is adjacent to the first edge connector pin, and is configured as a signal connector pin.

16. The printed circuit board of any of clauses 13-15, wherein the third edge connector pin is not coupled to a tie bar stub.

17. In some embodiments, a printed circuit board includes: a laminate substrate that includes at least one electrically insulating later; and a plurality of edge connector pins that are formed on the at least one electrically insulating layer, wherein the plurality of edge connector pins includes: a first edge connector pin that is configured as a ground connector pin; and a second edge connector pin that is configured as a signal connector pin, wherein, the at least one electrically insulating layer has a hole that forms both a first portion of a first edge of the first edge connector pin and a second portion of a second edge of the second edge connector pin.

18. The printed circuit board of clause 17, wherein the first edge connector pin is adjacent to the second edge connector pin, and the first edge connector pin and the second edge connector pin are included in the plurality of edge connector pins.

19. The printed circuit board of clauses 17 or 18, wherein the hole is disposed between at least a portion of the first edge connector pin and a portion of the second edge connector pin.

20. The printed circuit board of any of clauses 17-19, further comprising an electrically insulating material disposed in the hole.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in at least one computer readable medium having computer readable program code embodied thereon.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method for forming a printed circuit board, the method comprising:
   forming on a substrate a first conductive layer for a first edge connector pin and a first conductive layer for a second edge connector pin, wherein the first conductive layer for the first edge connector pin and the first conductive layer for the second edge connector pin are electrically coupled to one another via a first conductive layer for an electrical bridging element;
   electroplating a second conductive layer onto both the first conductive layer for the first edge connector pin and the first conductive layer for the second edge connector pin via a plating current conductor; and
   removing at least a portion of the electrical bridging element to electrically separate the first edge connector pin from the second edge connector pin.

2. The method of claim 1, wherein removing the at least a portion of the electrical bridging element comprises performing a mechanical drilling operation on the electrical bridging element.

3. The method of claim 1, wherein the first conductive layer for the first edge connector pin, the second edge connector pin, and the electrical bridging element are formed on a same surface of the substrate.

4. The method of claim 1, wherein electroplating the second conductive layer onto both the first conductive layer for the first edge connector pin and the first conductive layer for the second edge connector pin comprises applying a plating bias to both the first edge connector pin and the second edge connector pin via the plating current conductor.

5. The method of claim 1, wherein at least a portion of the plating current conductor is disposed outside a perimeter of the printed circuit board.

6. The method of claim 1, wherein the first edge connector pin is configured as a non-signal-carrying connector pin, and the second edge connector pin is configured as a signal-carrying connector pin.

7. The method of claim 6, wherein a first conductive layer for the plating current conductor is coupled directly to the first conductive layer for the first edge connector pin and is coupled indirectly to the first conductive layer for the second edge connector pin.

8. The method of claim 6, wherein a first conductive layer of the plating current conductor is electrically coupled to the first conductive layer for the first edge connector pin via a ground plane of the printed circuit board.

9. The method of claim 6, wherein a first conductive layer for the first edge connector pin is electrically coupled to a ground plane of the printed circuit board by at least one via of the printed circuit board.

10. The method of claim 6, wherein forming the first conductive layer for the first edge connector pin on the substrate comprises concurrently forming a ground plane of the printed circuit board.

11. The method of claim 1, wherein forming the first conductive layer for the first edge connector pin on the substrate comprises concurrently forming a first conductive layer for the electrical bridging element and a first conductive layer for the plating current conductor.

12. The method of claim 1, wherein electrically separating the first edge connector pin from the second edge connector pin is performed after electroplating the second layer onto the first conductive layer of the first edge connector pin and the first conductive layer of the second edge connector pin.

* * * * *